United States Patent
Zill et al.

(10) Patent No.: US 10,264,713 B2
(45) Date of Patent: Apr. 16, 2019

(54) LIQUID COOLING SYSTEM WITH EXTENDED MICROCHANNEL AND METHOD THEREFOR

(71) Applicant: DELL PRODUCTS, LP, Round Rock, TX (US)

(72) Inventors: Jay M. Zill, Round Rock, TX (US); Travis C. North, Cedar Park, TX (US)

(73) Assignee: Dell Products, LP, Round Rock, TX (US)

( * ) Notice: Subject to any disclaimer, the term of this patent is extended or adjusted under 35 U.S.C. 154(b) by 0 days.

(21) Appl. No.: 15/242,234

(22) Filed: Aug. 19, 2016

(65) Prior Publication Data

US 2018/0054924 A1 Feb. 22, 2018

(51) Int. Cl.
*H05K 7/20* (2006.01)
*F28D 1/02* (2006.01)
*F28D 1/053* (2006.01)
*F28F 1/02* (2006.01)
*F28D 21/00* (2006.01)

(52) U.S. Cl.
CPC ....... *H05K 7/20772* (2013.01); *F28D 1/0233* (2013.01); *F28D 1/05366* (2013.01); *F28F 1/025* (2013.01); *F28D 2021/0031* (2013.01); *F28F 2260/02* (2013.01)

(58) Field of Classification Search
CPC ................................................. F28F 2260/02
See application file for complete search history.

(56) References Cited

U.S. PATENT DOCUMENTS

| | | | | |
|---|---|---|---|---|
| 5,099,576 A | * | 3/1992 | Shinmura | B21D 53/085 165/153 |
| 5,402,034 A | | 3/1995 | Blouch et al. | |
| 6,340,055 B1 | * | 1/2002 | Yamauchi | F28D 1/05391 165/153 |
| 7,418,999 B2 | * | 9/2008 | Takano | F25B 39/02 165/110 |
| 2003/0131981 A1 | * | 7/2003 | Kohler | F28D 1/0478 165/178 |
| 2004/0065394 A1 | * | 4/2004 | Ryu | B21D 26/033 148/695 |
| 2008/0105420 A1 | * | 5/2008 | Taras | F25B 39/00 165/174 |
| 2009/0084525 A1 | * | 4/2009 | Satou | F28D 15/0266 165/104.21 |
| 2009/0211288 A1 | | 8/2009 | Simeone et al. | |
| 2011/0139423 A1 | * | 6/2011 | Troutman | F25B 39/04 165/173 |
| 2013/0213081 A1 | | 8/2013 | Zhang et al. | |

FOREIGN PATENT DOCUMENTS

EP 1 557 622 A2 7/2005

* cited by examiner

*Primary Examiner* — Mukundbhai G Patel
(74) *Attorney, Agent, or Firm* — Larson Newman, LLP

(57) ABSTRACT

A heat exchanger includes a flat tube microchannel. A major surface of the microchannel has a first width at a first and a second opposite end portion to couple each end portion to a corresponding fluid distribution header. A middle portion of the microchannel between the first and second end portions has a second width that is greater than the first width. Fins are attached to the middle portion of the first major surface of the flat tube microchannel.

8 Claims, 6 Drawing Sheets

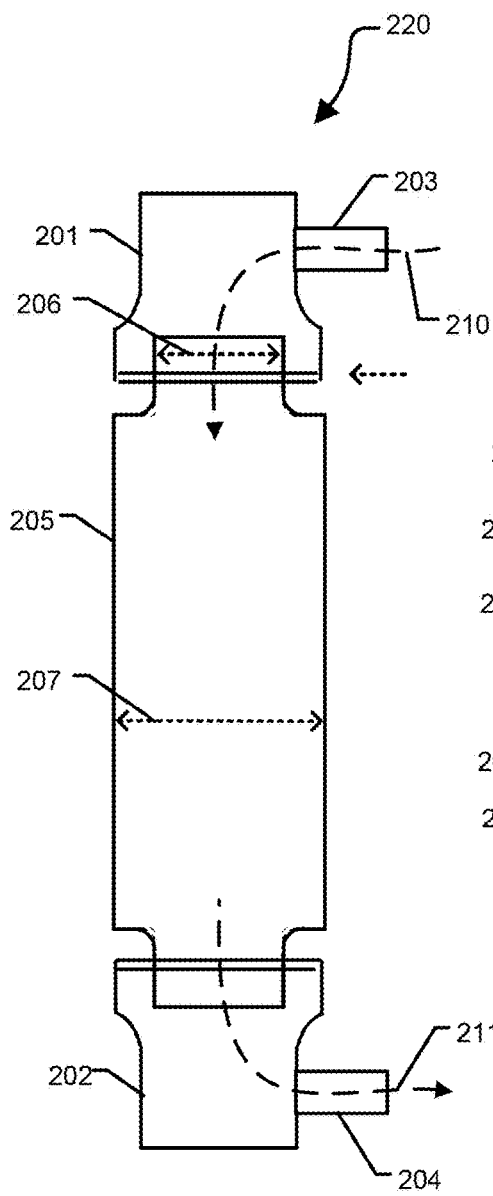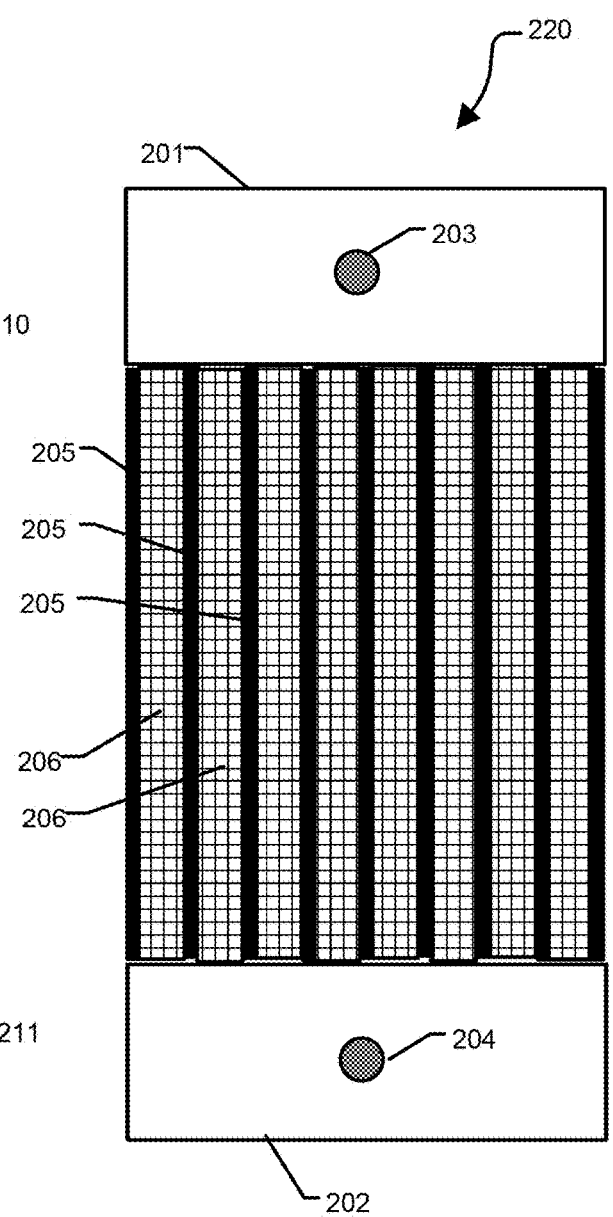
*FIG. 3*     *FIG. 4*

LIQUID COOLING SYSTEM WITH EXTENDED MICROCHANNEL AND METHOD THEREFOR

FIELD OF THE DISCLOSURE

This disclosure relates generally to information handling systems, and more particularly relates to a liquid cooling system having an extended microchannel.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A heat exchanger includes a flat tube microchannel. A major surface of the microchannel has a first width at opposite end portions to couple each end portion to a corresponding fluid distribution header. A middle portion of the microchannel has a second width that is greater than the first width. Fins are attached to the middle portion of the first major surface of the flat tube microchannel.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which:

FIG. 3 is a side view of the radiator of FIG. 2 illustrating a flat tube microchannel having an extended midsection according to a specific embodiment of the present disclosure;

FIG. 4 is a front view of the radiator of FIG. 3 according to a specific embodiment of the present disclosure;

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

An information handling system includes at least one central processing unit (CPU) and other devices that generate heat during operation. This heat must be removed from these devices to maximize computation performance and operational lifetime of these devices. Traditionally, a heat-sink-fan assembly has been attached to the CPU to remove heat from the CPU, which is exhausted from the information handling system chassis using one or more fans. Liquid cooling systems are a popular replacement for the traditional heat sink. A liquid cooling system typically includes a waterblock/cold plate that is secured in close contact with the CPU. A liquid is circulated through the waterblock using a pump. During operation of the information handling system, the water is heated by the CPU, and is further circulated via tubing through a heat exchanger (radiator), where the heat is removed from the liquid before returning to an inlet side of the waterblock. At the heat exchanger, the liquid passes through multiple thin flat tubes that have metal fins attached across their surfaces, thus providing a large surface area to dissipate heat. FIGS. 1-10 illustrate techniques for improving the cooling efficiency of a liquid-cooling system at an information handling system. In particular, flat tube microchannels included at a liquid-to-air heat exchanger are fabricated to have a portion located between fluid distribution headers (manifolds) that are wider relative to their width at opposite ends of the microchannel that attach the microchannel to the headers. Accordingly, an area of fins that are disposed across the surface of the flat tube microchannel can be increased relative to conventional microchannels having a consistent width from end to end. In other words, heat-dissipating fins can be disposed throughout the volume of the heat exchanger.

Figure 1:
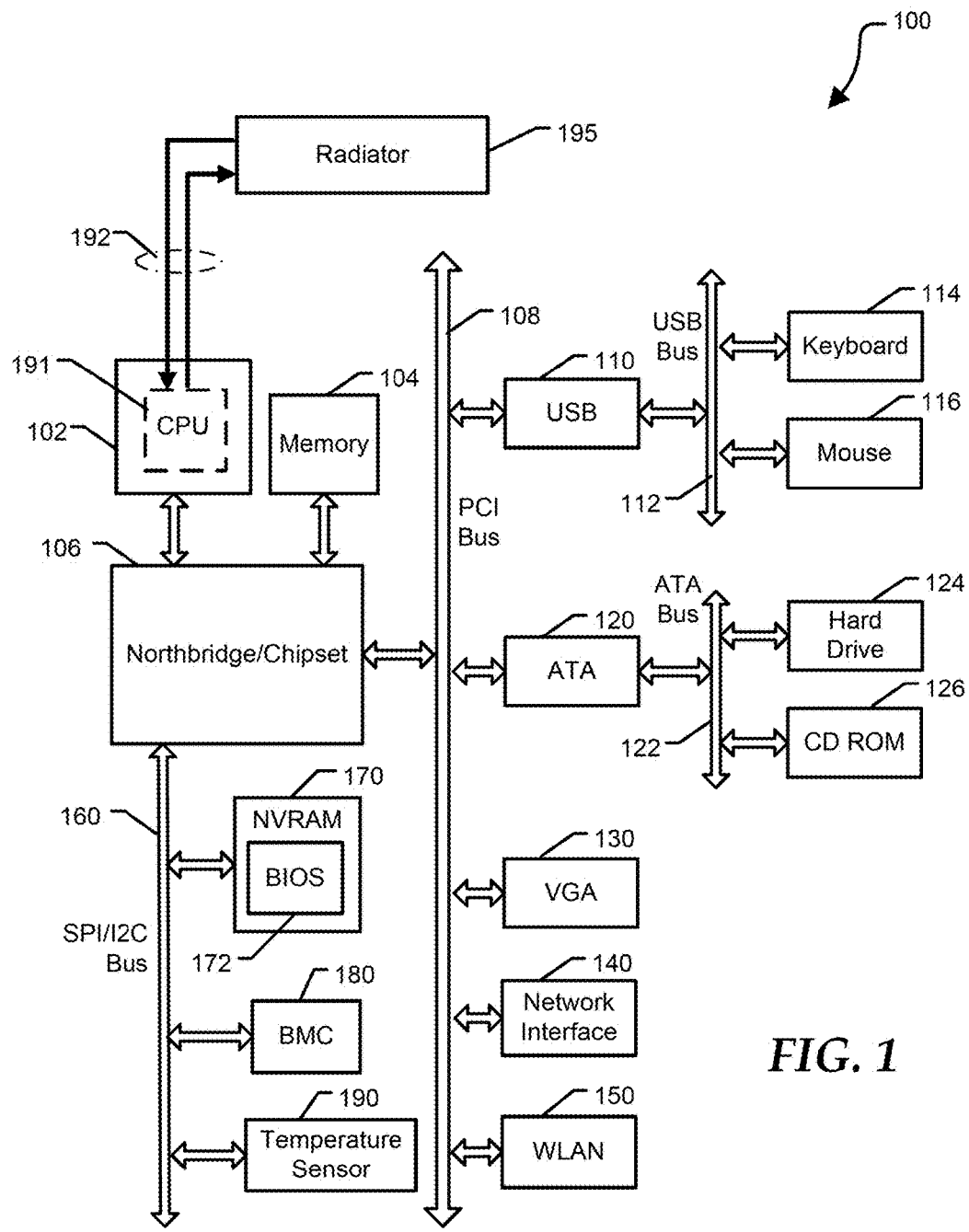
FIG. 1 is a block diagram of an information handling system according to an embodiment of the present disclosure.

FIG. 1 shows an information handling system 100 including a central processing unit (CPU) 102, a memory 104, a northbridge/chipset 106, a PCI bus 108, a universal serial bus (USB) controller 110, a USB 112, a keyboard device controller 114, a mouse device controller 116, a configuration an ATA bus controller 120, an ATA bus 122, a hard drive device controller 124, a compact disk read only memory (CD ROM) device controller 126, a video graphics array (VGA) device controller 130, a network interface controller (NIC) 140, a wireless local area network (WLAN) controller 150, a serial peripheral interface (SPI) bus 160, a NVRAM 170 for storing BIOS 172, a baseboard management controller (BMC) 180, and a temperature sensor 190. System 100 is equipped with a liquid cooling system including, a water block 191, tubing 192, and a radiator 195. The design and operation of the liquid cooling system is described below with reference to FIGS. 2-10.

System 100 can include additional processors (not shown at FIG. 1) that are configured to provide localized or specific control functions, such as a battery management controller. Bus 160 can include one or more busses, including an I2C bus, a system management bus (SMBUS), a power management bus (PMBUS), and the like. BMC 180 can be configured to provide out-of-band access to devices at information handling system 100. As used herein, out-of-band access herein refers to operations performed prior to execution of BIOS 172 by processor 102 to initialize operation of system 100.

Information handling system 100 can include additional components and additional busses, not shown for clarity. For example, system 100 can include multiple processor cores, audio devices, and the like. While a particular arrangement of bus technologies and interconnections is illustrated for the purpose of example, one of skill will appreciate that the techniques disclosed herein are applicable to other system architectures. System 100 can include multiple CPUs and redundant bus controllers. One ore more components can be integrated together. For example, portions of northbridge/chipset 106 can be integrated within CPU 102. Additional components of information handling system 100 can include one or more storage devices that can store machine-executable code, one or more communications ports for communicating with external devices, and various input and output (I/O) devices, such as a keyboard, a mouse, and a video display.

For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch, a router, or another network communication device, or any other suitable device and may vary in size, shape, performance, functionality, and price. Further, information handling system 100 can include processing resources for executing machine-executable code, such as CPU 102, a programmable logic array (PLA), an embedded device such as a System-on-a-Chip (SoC), or other control logic hardware. Information handling system 100 can also include one or more computer-readable medium for storing machine-executable code, such as software or data.

Figure 2:
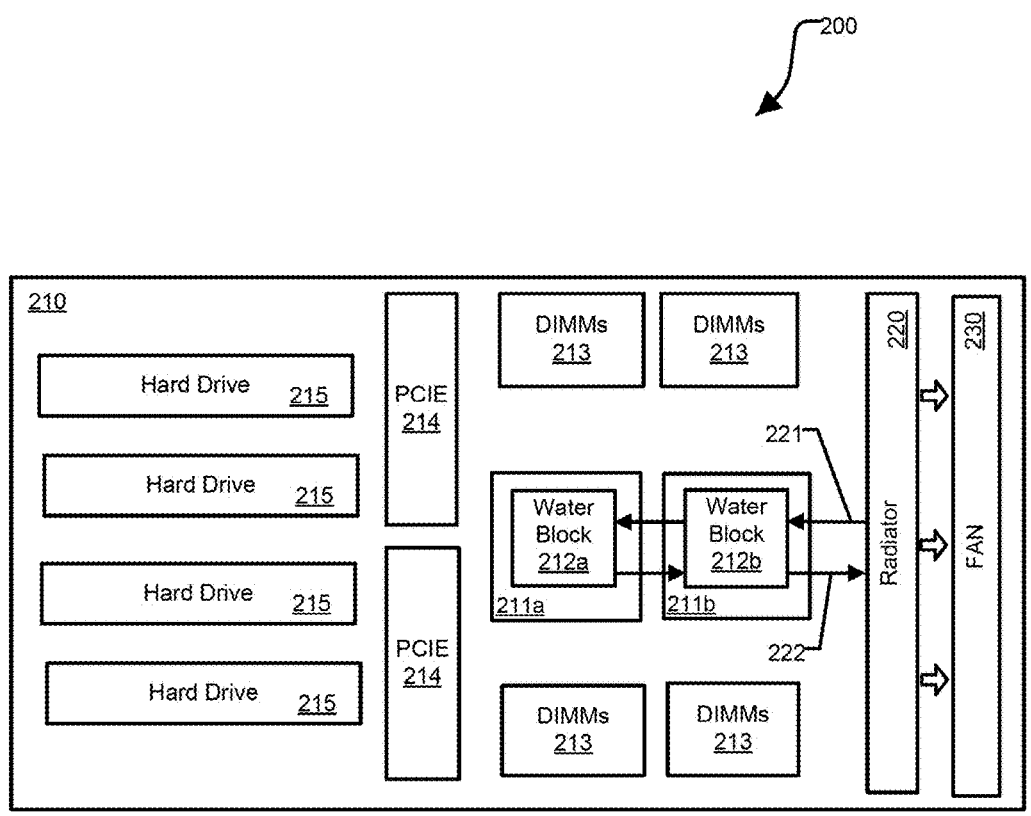
FIG. 2 is a block diagram of a server chassis including a liquid cooling system having a radiator with extended flat tube microchannels according to an embodiment of the present disclosure.

FIG. 2 shows a server chassis 200 including a liquid cooling system having a radiator with extended flat tube micro-channels according to an embodiment of the present disclosure. Chassis 200 includes an IT node 210. Chassis 200 may represent a portion of a larger RIHS that includes many IT nodes. IT node 210 includes CPUs 211a and 211b, dual in-line memory modules (DIMMs) 213, Peripheral Component Interconnect Express (PCIE) devices 214, and hard disk drives (HDDs) 215. An IT node can include different components based on the nodes purpose. While most components included in an IT node generate heat during operation, for the purpose of this example, CPUs 211a and 211b are each equipped with a waterblock or liquid manifold 212a and 212b, respectively, to provide cooling, while the other components included in the node are cooled by air circulating through the node. Chassis 200 further includes a radiator 220 and fan 230. Radiator 220 is coupled to water blocks 212a and 212b by tubing 221 and 222. As disclosed herein, radiator 220 includes flat tube microchannels fabricated to have a portion located between fluid distribution headers (manifolds included within radiator 220 that couple to the microchannels and to tubing 221 and 222) that are wider relative to their width at opposite ends of the microchannel that attach the microchannel to the headers.

During operation of chassis 200, fan 230 pulls through chassis 220 and expels the heated air from the chassis. Alternatively, fan 230 can be configured to draw cool air into chassis 200, circulating the air though radiator 220 and the rest of node 210. As the air passes through radiator 220, the cooling liquid circulating through the radiator is cooled before returning via tube 221 to waterblocks 212a and 212b. As the coolant flows through waterblocks 212a and 212b, the coolant absorbs heat generated by CPUs 211a and 211b, and is pumped back to radiator 220 via tube 222. For clarity, only CPUs 211a and 211b are shown equipped with liquid cooling manifolds 212a and 212b, however other components included at IT node 210, or other components associated with chassis 200 (not shown at FIG. 2) can be cooled by the liquid cooling system. The effectiveness of radiator 220, to remove heat from node 210, is largely based on a total surface area of the microchannels and associated fin array included in radiator 220. The extended microchannels disclosed herein provide increased surface area and better utilize the area and volume of radiator 220.

FIG. 3 shows radiator 220 of FIG. 2 illustrating a flat tube micro-channel having an extended midsection according to a specific embodiment of the present disclosure. Radiator 220 includes fluid distribution headers 201 and 202, coolant inlet 203, coolant outlet 204, and a flat tube microchannel 205. FIG. 3 shows one of two major surfaces of microchannel 205. Reference 210 illustrates a flow of coolant during operation of radiator 220. Fin material that would be attached to the major surface of microchannel 205 is not shown for clarity. Flat tube microchannel 205 is typically aluminum or copper, and is hollow, allowing coolant to enter an opening enclosed in header 201 and pass through the microchannel exiting at an opening enclosed in header 202. Radiator 220 can include multiple microchannels; each sealed to headers 201 and 202 so that coolant must flow through the microchannels as it travels from header 201 to header 202. A microchannel is typically thin in the minor direction (not shown at FIG. 3), for example 1 mm. The major surface of microchannel 205, as seen in FIG. 3, is wider in the midsection than it is at either end. For example, the midsection of microchannel 205 illustrated by reference 207 can be approximately 27 mm, while a width at each end, illustrated by reference 206 can be approximately 16 mm. By increasing the width at the midsection of microchannel 205, additional fin material can be attached to each microchannel relative to a conventional microchannel having a consistent width from end to end.

FIG. 4 shows nine microchannels 205 disposed between headers 201 and 202. Interspersed between each microchannel is a fin array 206. Fin arrays 206 are typically brazed to the adjacent microchannels. As described above, coolant enters header 201 at inlet 203, circulates through each microchannel, and exits at outlet 204. Headers 201 and 202 act as a manifold, distributing the flow of coolant substantially equally amongst each microchannel. The coolant is typically deionized water and can include corrosion inhibitors, although other liquids can be used.

Figures 5, 6:
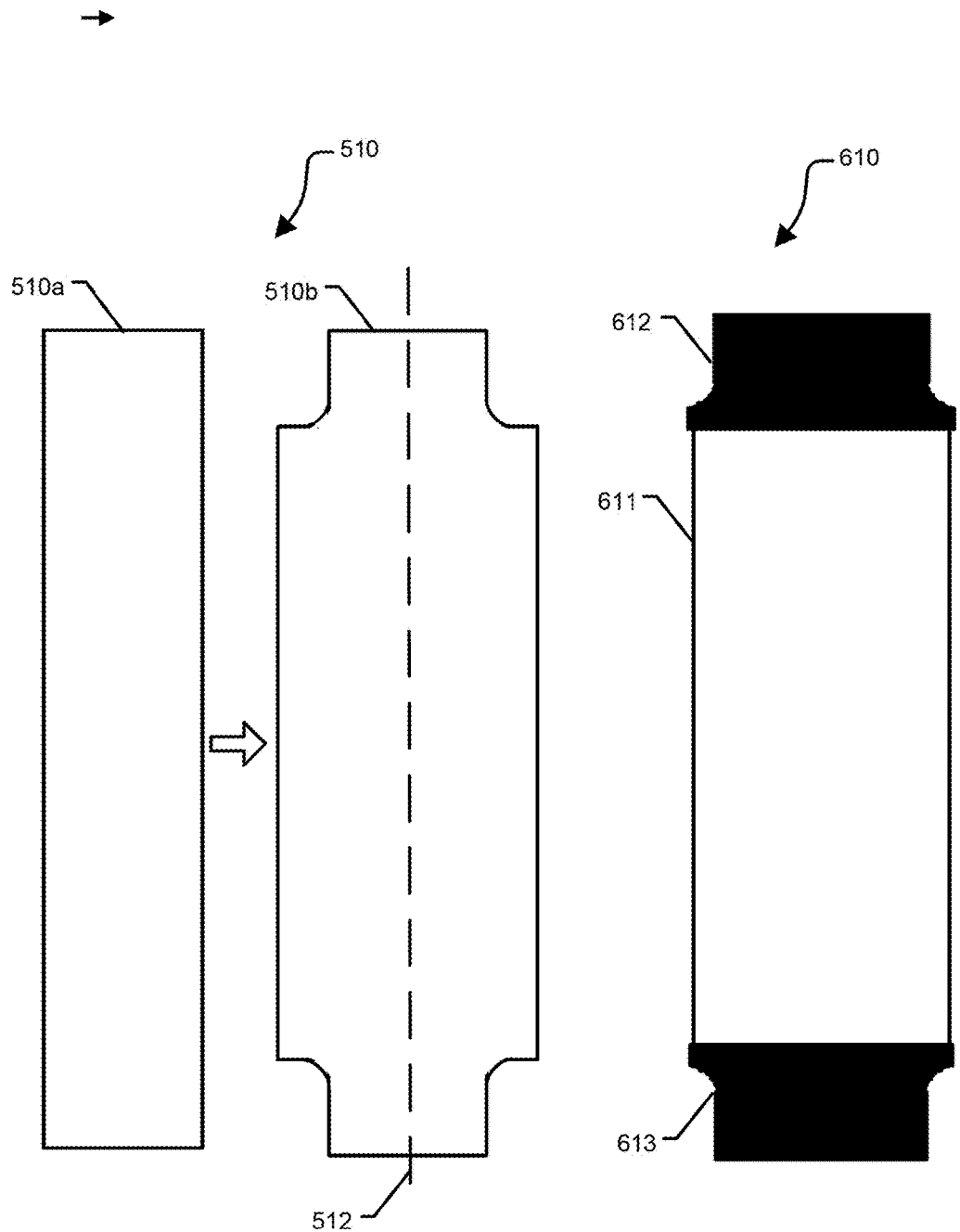
FIG. 5 shows front views of a flat tube microchannel before and after extending the midsection according to an embodiment of the present disclosure.
FIG. 6 shows a front view of a flat tube microchannel with expansion joints providing an interface to a radiator header according to an embodiment of the present disclosure.

FIG. 5 shows front views of a flat tube micro-channel 510 before and after extending the midsection according to an embodiment of the present disclosure. In this particular embodiment, a fabrication process known as hydroforming is used to extend the midsection of a microchannel. A microchannel 510*a* having uniform width is placed into tooling that defines the extended shape of microchannel 510*b*. Water under high pressure essentially inflates the microchannel to fill the void in the tooling. The resulting microchannel 510*b* is a single continuous metal tube structure. Accordingly, microchannel 510*b* provides a greater surface area to which fins can be attached than the original microchannel 510*a*. Microchannel 510*b* is extended symmetrically about a central axis 512. The narrow portions of microchannel 510 are inserted into corresponding slots of a header manifold (not shown in FIG. 5).

FIG. 6 shows a front view of a flat tube micro-channel 610 with expansion joints providing an interface to a radiator header according to an embodiment of the present disclosure. Microchannel 610 includes a flat tube microchannel 611, an expansion joint 612 that is brazed or otherwise coupled to one end of microchannel tube 611, and another expansion joint 613 coupled to the opposite end of microchannel tube 611. Like microchannel 611, expansion joints 612 and 613 are hollow, permitting coolant to flow from one radiator header, through expansion joint 612, microchannel 611, and expansion joint 613, and into a second radiator header. The narrow portions of expansion joints 612 and 613 are inserted into corresponding slots of a header manifold (not shown in FIG. 6). Expansion joints 612 and 613 can be made of metal, such as aluminum, that is brazed to microchannel tube 611.

Figure 7:
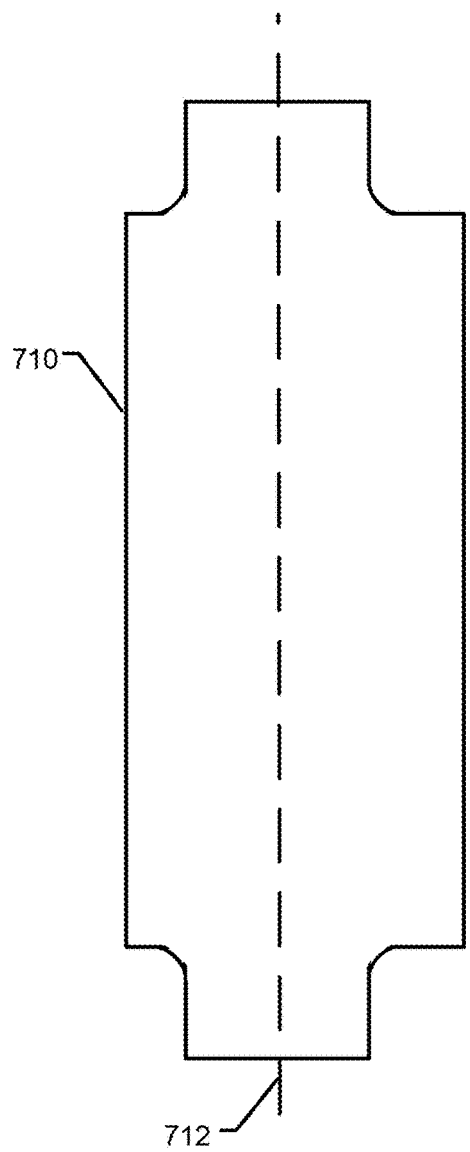
FIG. 7 shows a front view of a flat tube microchannel having an asymmetrical profile according to an embodiment of the present disclosure.

FIG. 7 shows a front view of a flat tube microchannel 710 having asymmetrical profiles according to an embodiments of the present disclosure. In particular, the midsection of microchannel 710 is extended asymmetrically about a central axis 712. The asymmetrical shape of microchannel 710 can permit adding further fin array material and to accommodate various dimensional restrictions of the radiator headers, fan, or chassis.

Figure 8:
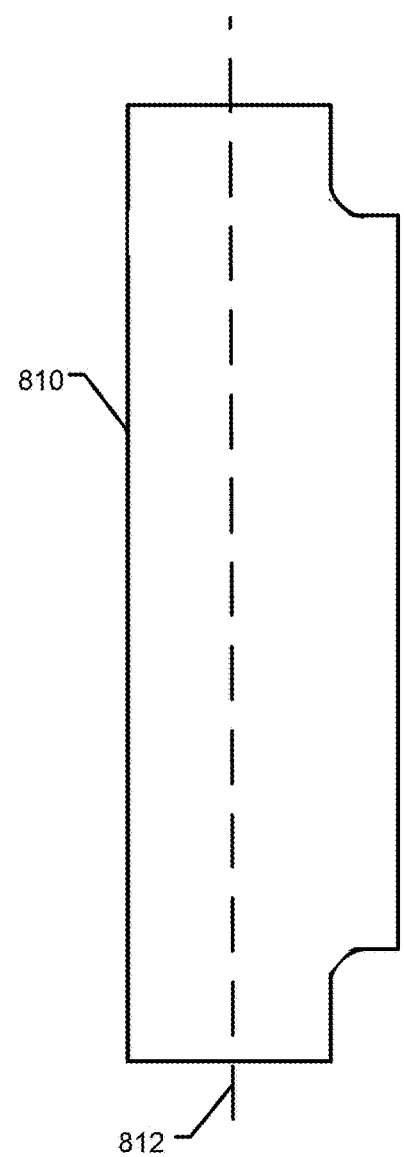
FIG. 8 shows a front view of a flat tube microchannel having an asymmetrical profile according to another embodiment of the present disclosure.

FIG. 8 shows a front view of a flat tube microchannel 810 having asymmetrical profiles according to another embodiments of the present disclosure. In particular, a midsection of microchannel 810 is extended in only one direction relative to a central axis 812. As above, the asymmetrical shape of microchannel 810 can accommodate various dimensional restrictions of the radiator headers, fan, or chassis.

Figure 9:
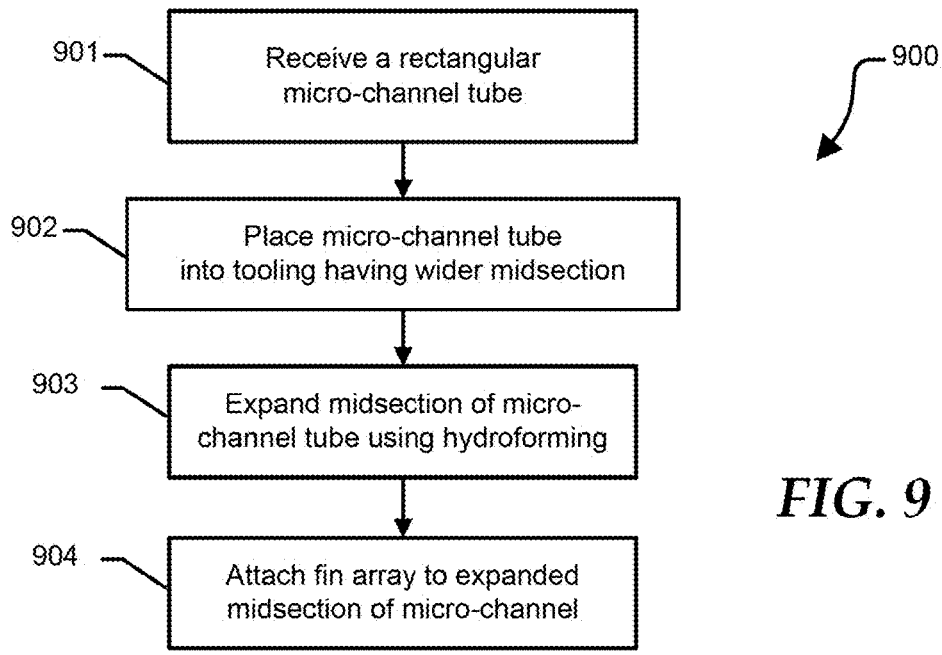
FIG. 9 is a flow diagram illustrating a method for fabricating a flat tube micro-channel having an extended midsection according to a specific embodiment of the present disclosure.

FIG. 9 shows a method 900 for fabricating a flat tube micro-channel having an extended midsection according to a specific embodiment of the present disclosure. Method 900 may correspond to construction of microchannel 510 of FIG. 5. The method begins at block 901 where a flat tube microchannel material having a uniform width is received. At block 902, the microchannel material is placed into tooling that defines a microchannel having a midsection that is wider than its opposite ends. At block 903, the midsection of the microchannel material is expanded using water under high pressure using a manufacturing technique known as hydroforming. The method completes at block 904 where a fin array can be attached to the expanded mid section of the microchannel.

Figure 10:
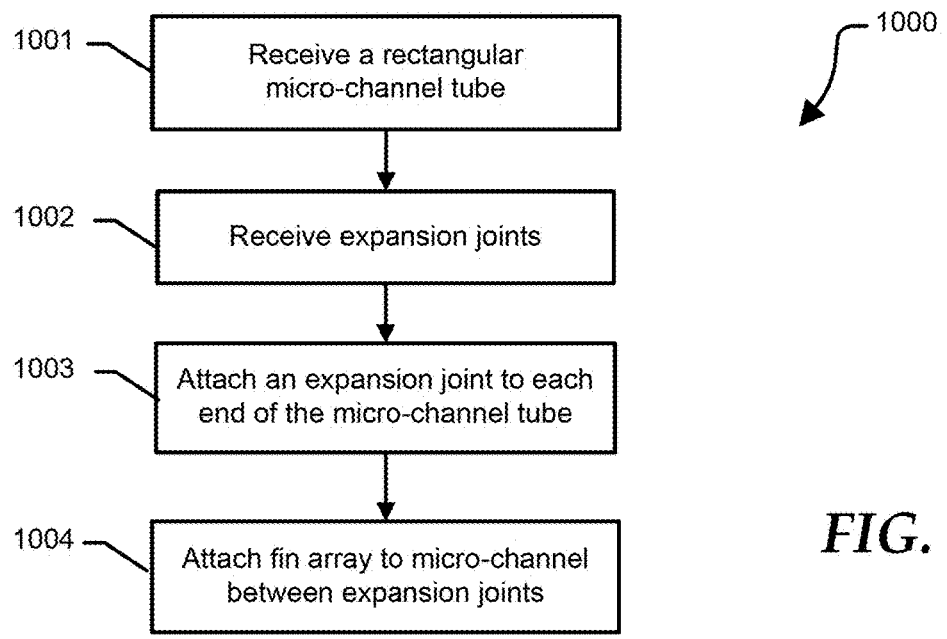
FIG. 10 is a flow diagram illustrating a method for fabricating a flat tube micro-channel having an extended midsection according to another embodiment of the present disclosure.

FIG. 10 shows a method 1000 or fabricating a flat tube micro-channel having an extended midsection according to another embodiment of the present disclosure. Method 1000 may correspond to construction of microchannel 610 of FIG. 6. The method begins at block 1001 where a flat tube microchannel material having a uniform width is received. At block 1002 two expansion joints are received. The expansion joints have a narrow end that interfaces with a radiator header, and a wider end that is configured to couple with the microchannel tube of block 1001. At block 1003, an expansion joint is attached to each end of the microchannel. The method completes at block 904 where a fin array can be attached to the expanded mid section of the microchannel.

Referring back to FIG. 1, the information handling system 100 can include a set of instructions that can be executed to cause the information handling system to perform any one or more of the methods or computer based functions disclosed herein. The information handling system 100 may operate as a standalone device or may be connected to other computer systems or peripheral devices, such as by a network.

In a networked deployment, the information handling system 100 may operate in the capacity of a server or as a client user computer in a server-client user network environment, or as a peer computer system in a peer-to-peer (or distributed) network environment. In a particular embodiment, the computer system 100 can be implemented using electronic devices that provide voice, video or data communication. Further, while a single information handling system 100 is illustrated, the term "system" shall also be taken to include any collection of systems or sub-systems that individually or jointly execute a set, or multiple sets, of instructions to perform one or more computer functions.

The information handling system 100 can include a disk drive unit and may include a computer-readable medium, not shown in FIG. 1, in which one or more sets of instructions, such as software, can be embedded. Further, the instructions may embody one or more of the methods or logic as described herein. In a particular embodiment, the instructions may reside completely, or at least partially, within system memory 104 or another memory included at system 100, and/or within the processor 102 during execution by the information handling system 100. The system memory 104 and the processor 102 also may include computer-readable media. A network interface device (not shown at FIG. 1) can provide connectivity to a network, such as a wide area network (WAN), a local area network (LAN), or other network.

In an alternative embodiment, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions or receives and executes instructions responsive to a propagated signal; so that a device connected to a network can communicate voice, video or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories.

Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system radiator comprising: heat exchanger including:

a plurality of flat tube microchannels, each flat tube microchannel to carry liquid coolant between a first fluid distribution header and a second fluid distribution header, wherein a major surface of the flat tube microchannel has a first width at a first and a second opposite end portion to couple each end portion to a corresponding one of the first and second fluid distribution headers, and wherein the major surface of the flat tube microchannel has a hydroformed middle portion between the first and second end portions having a second width that is greater than the first width, the major surface parallel with a direction of air flow during operation of the heat exchanger; and fins attached to the middle portion of the major surface of the flat tube microchannel, an area of fins that are disposed across the major surface of the flat tube microchannel being greater than an area of fins disposed across a second flat tube microchannel having a consistent width from end to end;

a water block in contact with a heat-generating device; and first and second tubes to convey liquid coolant to and from the water block and the heat exchanger, wherein the flat tube microchannel is hollow, having only one opening throughout to carry the liquid coolant between the first fluid distribution header and the second fluid distribution header, and wherein the middle portion of the flat tube microchannel is asymmetrical across the major surface about a center line extending from a middle of the first end portion to a middle of the second end portion.

2. The information handling system of claim 1, wherein the second width is approximately equal to an exterior width of the fluid distribution header, the exterior width measured in a direction parallel with the major surface of the flat tube microchannel when the flat tube microchannel is attached to the header.

3. The information handling system of claim 1, wherein an area of the fins is approximately equal to a cross sectional area of the heat exchanger, the cross sectional area parallel with the major surface of the flat tube microchannel.

4. The information handling system of claim 1, wherein the flat tube microchannel comprises a single continuous material.

5. A method comprising:

providing a heat exchanger at an information handling system, the heat exchanger including a plurality of flat tube microchannels, each flat tube microchannel to carry liquid coolant between a first fluid distribution header and a second fluid distribution header at the heat exchanger, the flat tube microchannel having a first width measured across a major surface of a middle portion of the flat tube microchannel that is wider than a second width measured across the major surface of the flat tube microchannel at each opposite end of the flat tube microchannel, the major surface parallel to a direction of air flow through the heat exchanger, the middle portion made wider than the end portions by hydroforming;

attaching a plurality of fins to the middle portion of the major surface of the flat tube microchannel; and attaching each end of the flat tube microchannel to a corresponding one of the first and second fluid distribution headers, wherein the flat tube microchannel is hollow, having only one opening throughout to carry the liquid coolant between the first fluid distribution header and the second fluid distribution header, and wherein the middle portion of the flat tube microchannel is asymmetrical across the major surface about a center line extending from a middle of the first end portion to a middle of the second end portion.

6. The method of claim 5, wherein the flat tube microchannel comprises a single continuous material.

7. The method of claim 5, wherein the first width is approximately equal to an exterior width of the fluid distribution header, the exterior width measured in a direction parallel with the major surface of the flat tube microchannel when the flat tube microchannel is attached to the header.

8. The method of claim 5, wherein an area of the fins is approximately equal to a cross sectional area of the heat exchanger, the cross sectional area parallel with the major surface of the flat tube microchannel.

* * * * *